United States Patent
Back et al.

[11] Patent Number: 5,854,091
[45] Date of Patent: Dec. 29, 1998

[54] METHOD FOR FABRICATING COLOR SOLID-STATE IMAGE SENSOR

[75] Inventors: Euy Hyeon Back, Chungcheongbuk-do; Sam Yeoul Kim, Seoul, both of Rep. of Korea

[73] Assignee: LG Semicon Co., Ltd., Chungcheongbuk-Do, Rep. of Korea

[21] Appl. No.: 883,146

[22] Filed: Jun. 27, 1997

[30] Foreign Application Priority Data

Dec. 28, 1996 [KR] Rep. of Korea .................. 1996 75480

[51] Int. Cl.$^6$ ....................................................... G03C 1/84
[52] U.S. Cl. .............................. 438/70; 438/69; 257/294; 257/440; 430/4
[58] Field of Search ......................... 438/70, 69; 257/294, 257/440

[56] References Cited

FOREIGN PATENT DOCUMENTS 63-276002  11/1988  Japan .

*Primary Examiner*—Charles L. Bowers, Jr.
*Assistant Examiner*—Keith Christianson
*Attorney, Agent, or Firm*—Morgan, Lewis & Bockius LLP

[57] ABSTRACT

A method for fabricating a color solid-state image sensor having a plurality of photoelectric conversion regions includes the steps of respectively forming a magenta color filter layer, a yellow color filter layer, and a cyan color filter layer over three photoelectric conversion regions of the plurality of photoelectric conversion regions; and implanting ions into the magenta and cyan color filter layers, thereby reducing transmittivity of blue composition of light which passes the magenta and cyan color filter layers.

15 Claims, 7 Drawing Sheets

5,854,091

METHOD FOR FABRICATING COLOR SOLID-STATE IMAGE SENSOR

This application claims the benefit of Korean Application No. 75480/1996 filed Dec. 28, 1996, which is hereby incorporated by reference.

BACKGROUND OF THE INVENTION

1. Field of the Invention

The present invention relates to a solid-state image sensor, and more particularly, to a method for fabricating a color solidstate image sensor.

2. Discussion of the Related Art

In general, visible light is an electromagnetic wave having an extremely short wavelength and a high frequency. The electromagnetic wave stimulates retina in a person's eye so that the person can see the light.

There are red, green and blue (R.G.B.) wavelengths in visible rays. To enable a white and black solid-state image sensor to operate in a color mode, a color filter is needed. A color filter usually includes an organic material that only transmits light of a specific wavelength band. For example, a blue color filter transmits light of the blue wavelength band and shields light of other wavelength bands. In order to improve photosensitivity, a color solid-state image sensor tends to adopt a composite color filter array including cyan, magenta, yellow and green. Therefore, the performance of a color solid-state image sensor depends on the transmittivity of different wavelength bands, instead of R.G.B color filtering.

A conventional method for fabricating a solid-state image sensor will be described with reference to the accompanying drawings.

FIG. 1A to FIG. 1E are sectional views illustrating a conventional method for fabricating a solid-state image sensor. FIG. 2A is a color diagram and FIG. 2B is a graph showing transmittivity of a color filter.

In the conventional solid-state image sensor, magenta, yellow and cyan color filter layers are respectively formed. As shown in FIG. 1A, a white and black solid-state image sensor 1 includes photodiode regions 2, vertical charge transfer regions 3 and horizontal charge transfer regions (not shown). The photodiode regions 2 convert a light image to a corresponding electrical signal, that is, an image charge. The vertical charge transfer regions 3 transfer the image charge produced from the photodiode regions 2 in the vertical direction. The horizontal charge transfer regions transfer the image charge in the horizontal direction. A first planarizing layer 4 is formed on the white and black solid-state image sensor 1.

As shown in FIG. 1B, a magenta color filter layer 5, a yellow color filter layer 6, and a cyan color filter layer 7 are sequentially formed on specific portion of the first planarizing layer 4 corresponding to the respective photodiode regions 2. To form these color filter layers, a colorable resist is deposited on the first planarizing layer 4 and patterned. Then, the patterned colorable resist layer is colored and hardened.

As shown in FIG. 1C, a second planarizing layer 8 is formed on the entire structure including the magenta, yellow, cyan color filter layers 5, 6, and 7. As shown in FIG. 1D, a microlens layer 9 is formed on the second planarizing layer 8 over the photodiode regions 2. Subsequently, a pad portion is opened by selectively removing the first and second planarizing layers 4 and 8, as shown in FIG. 1E.

The operation of the aforementioned conventional solid-state image sensor will be described below.

Incident light entering the solid-state image sensor is focused by the micro-lens layer 9 and passes through the respective color filter layers 5, 6 and 7, which only transmit light of a specific wavelength. The incident light is transferred to the corresponding photodiode regions 2.

The incident light is then converted to an electrical signal in the photodiode regions 2. The electrical signal is transferred in the vertical and horizontal directions by a clock signal applied to gates (not shown) formed on the horizontal and vertical charge transfer regions of the solid-state image sensor 1. The electrical signal is then sensed and amplified in a floating diffusion region (not shown) at the end of the horizontal charge transfer region to be transferred to peripheral circuits.

In the conventional solid-state image sensor, the magenta, cyan, and yellow color filter layers are respectively formed in locations corresponding to the respective photodiode regions 2.

The respective magenta, cyan and yellow color filter layers transmit only light of a specific wavelength. Transmittivities of light in the respective magenta, cyan and yellow color filter layers and their RGB compositions are shown in FIG. 2A and FIG. 2B.

RGB compositions of the magenta color filter layer are approximately 0.5:0:0.5, RGB compositions of the cyan filter layer are 0:0.5:0.5, and RGB compositions of the yellow filter layer are 0.5:0.5:0.

Since the conventional solid-state image sensor has the respective color filter layers separated from one another, it has several problems.

When varying spectral characteristic of the color filters, it is possible to vary the spectral characteristic in most of the visible ray wavelength region. However, it is hard to vary the spectral characteristic at either a short wavelength region or a long wavelength region. In other words, it is impossible to reduce photosensitivity of blue composition in the color filter layers when displaying the image signal of the solid-state image sensor because it is impossible to reduce the spectral characteristic of the short wavelength region. Since photosensitivity of blue composition in the color filter layers is extremely high, the separation characteristic of color signals passing through the corresponding color filters is deteriorated.

SUMMARY OF THE INVENTION

Accordingly, the present invention is directed to a method for fabricating a solid-state image sensor that substantially obviates one or more of the problems due to limitations and disadvantages of the related art.

An object of the present invention is to provide a method for fabricating a solid-state image sensor which improves spectral characteristic of color filter layers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a color solid-state image sensor having a plurality of photoelectric conversion regions includes the steps of: respectively forming magenta, yellow and cyan color filter layers over three photoelectric conversion regions of a plurality of the photoelectric conversion regions; and implanting ion into the magenta and cyan color filter layers, to reduce the transmittivity of blue composition among compositions of light that pass the magenta and cyan color filter layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Reference will now be made in detail to the preferred embodiments of the present invention, examples of which are illustrated in the accompanying drawings.

Figure 1A:
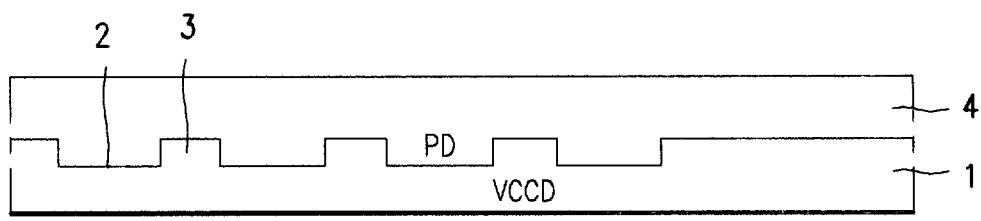
FIG. 1A to FIG. 1E are sectional views illustrating process steps of a conventional solid-state image sensor.
Figure 1B:
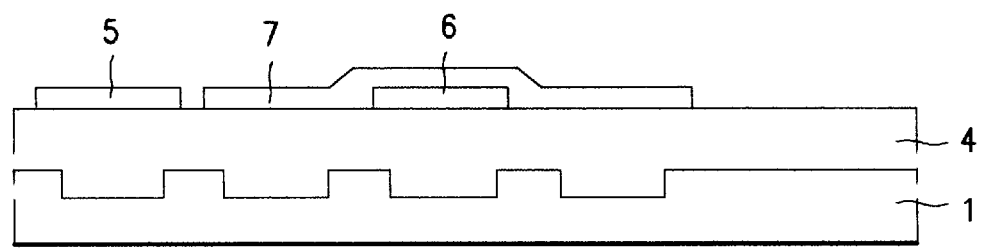
Figure 1C:
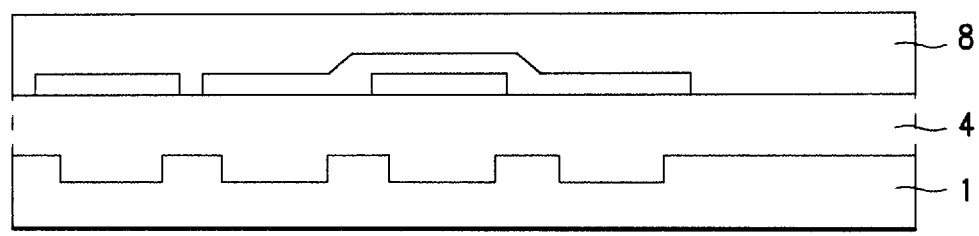
Figure 1D:
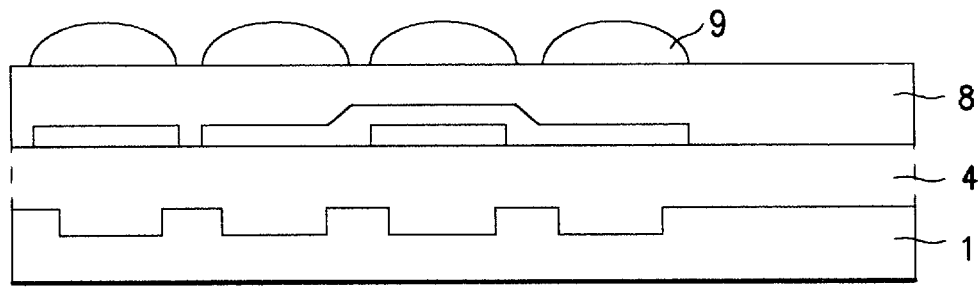
Figure 1E:
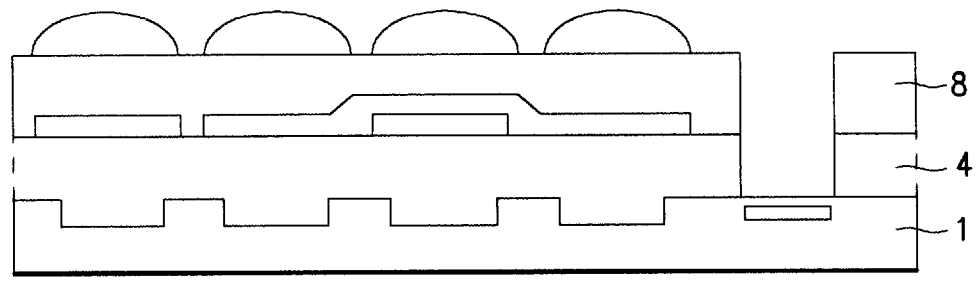
Figure 2A:
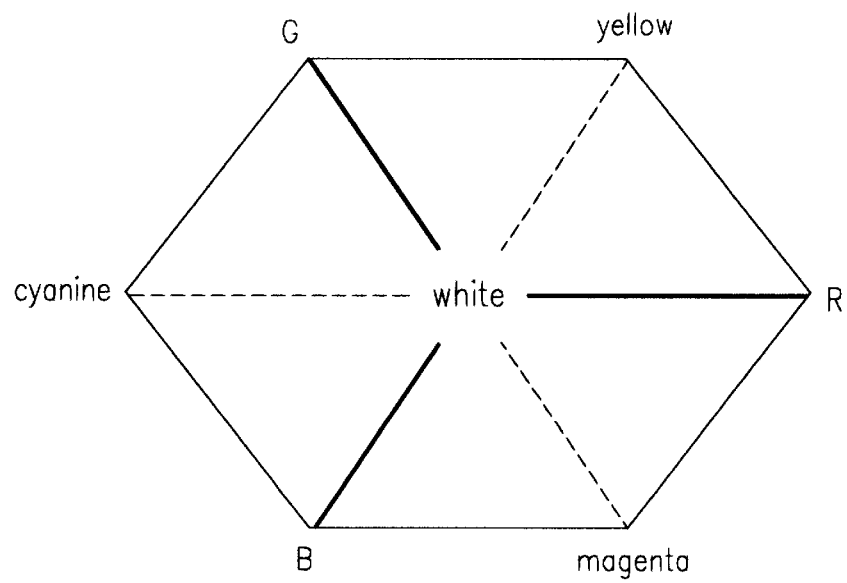
FIGS. 2A is a color diagram.
Figure 2B:
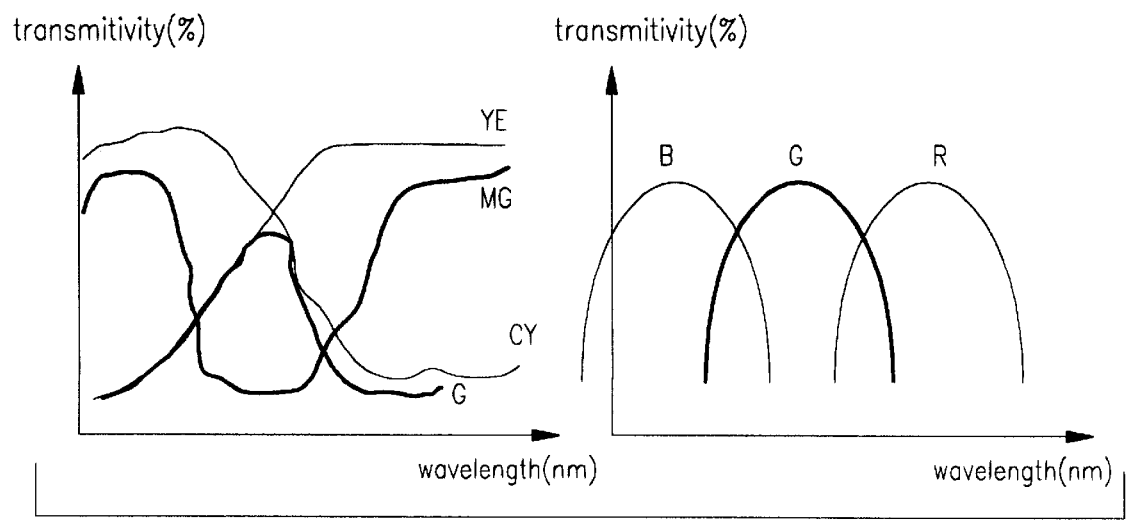
FIG. 2B is a graph showing transmittivity of color filter layers.
Figure 3A:
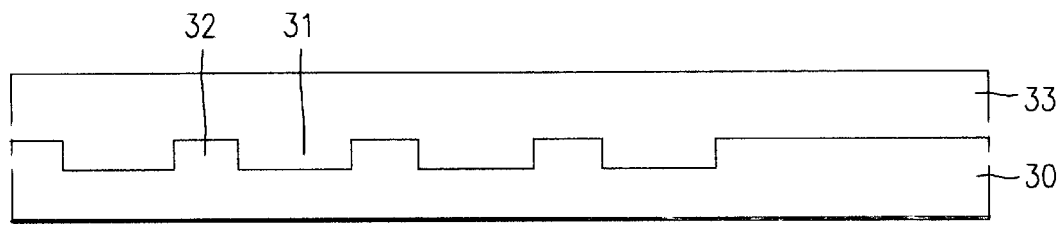
FIG. 3A to FIG. 3G are sectional views illustrating the process steps of a solid-state image sensor according to the present invention.

In a solid-state image sensor according to the present invention, ions are implanted into color filter layers of magenta and cyan to reduce transmittivity at a short wavelength band. Referring to FIG. 3A, a first planarizing layer 33 is formed on a white and black solid-state image sensor 30 including photoelectric conversion regions 31 (i.e. photodiode regions) and charge transfer regions 32. The photoelectric conversion regions 31 convert an image signal of incident light to an electrical signal, that is, an image charge. The charge transfer regions 32 transfer the image charge produced from the photoelectric conversion regions 31 in vertical and horizontal directions.

Figure 3B:
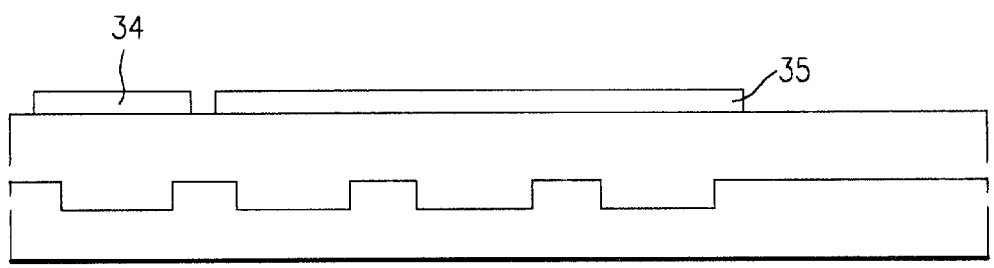

As shown in FIG. 3B, a first color filter layer 34 of magenta is formed on a portion of the first planarizing layer 33 corresponding to one of the photoelectric conversion regions 31. A second color filter layer 35 of cyan is formed on the first planarizing layer 33 where the first color filter layer 34 is not formed.

Figure 3C:
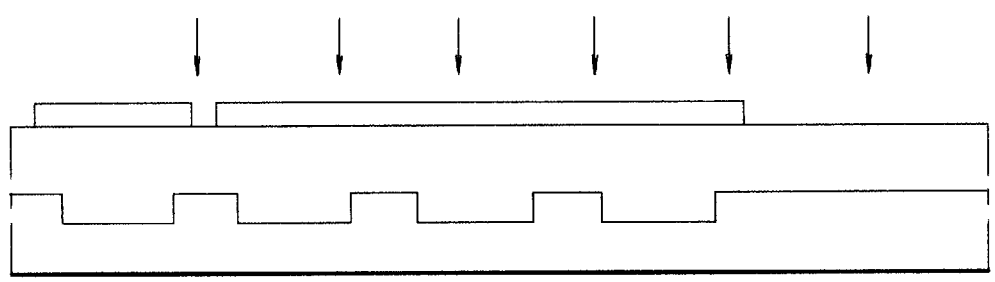

Subsequently, as shown in FIG. 3C, ions capable of varying the transmittivities of the first and second color filter layers 34 and 35 are implanted into the color filter layers 34 and 35. In such an ion implantation process, it is possible to use ions that are used in the conventional semiconductor process steps. In particular, Ar ions are desirable in view of the resultant transmittivity and stability.

Figure 3D:
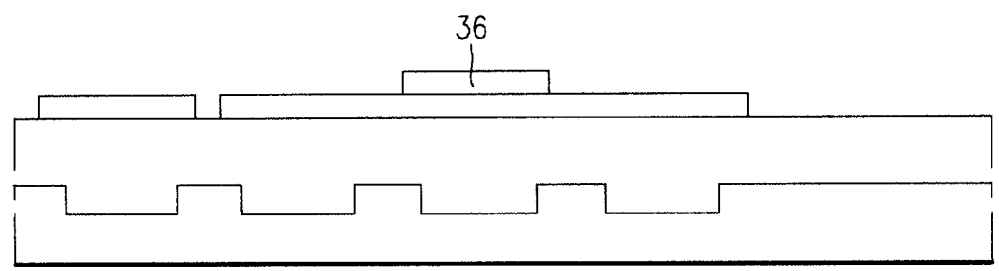

As shown in FIG. 3D, a third color filter layer 36 of yellow is formed on the second color filter layer 25 corresponding to one of the two photoelectric conversion regions 31 where the first color filter layer 34 is not formed.

To form the first, second, and third color filter layers 34, 35 and 36, a colorable resist is deposited on the first planarizing layer 33 and selectively patterned to remain on the specific photoelectric conversion regions 31. Thereafter, coloring and hardening processes are performed.

Figure 3E:
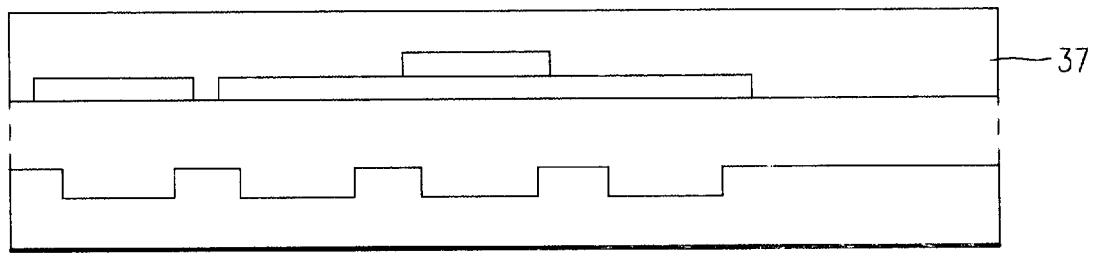

As shown in FIG. 3E, a second planarizing layer 37 is formed on the entire structure including the first, second, and third color filter layers 34, 35, and 36 so that micro-lens layers 38, which will be described later, can be accurately formed.

Figure 3F:
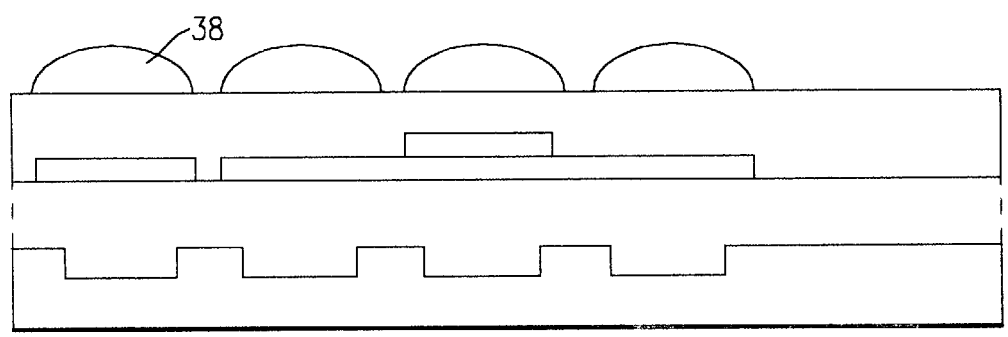
Figure 3G:
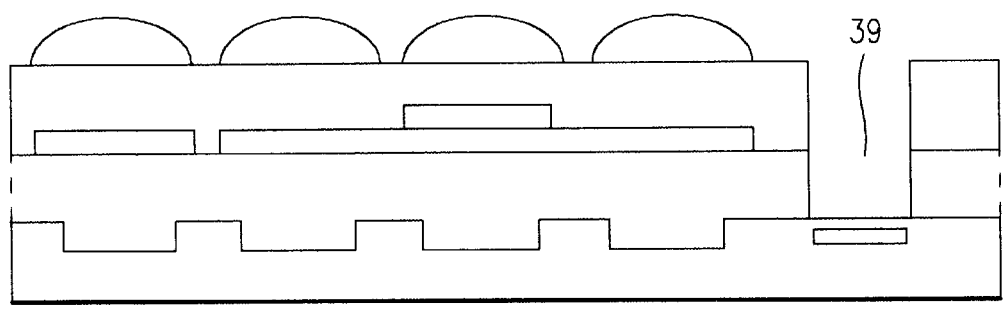

As shown in FIG. 3F, the micro-lens layers 38 are formed on the second planarizing layer 37 above and corresponding to each of the photodiode regions 31. A pad portion 39 is opened by selectively removing the first and second planarizing layers 33 and 37, as shown in FIG. 3G.

Incident light entering the solid-state image sensor is focused by the micro-lens layers 38 and passes the respective first, second, and third color filter layers 34, 35, and 36, which only transmit light of a specific wavelength to the corresponding photodiode regions 31.

The incident light transmitted to the photodiode regions 31 is converted to an electrical signal in the photodiode regions 31. The electrical signal is transferred in the vertical and horizontal directions by a clock signal applied to gates (not shown) formed on the charge transfer regions (including horizontal and vertical charge transfer regions) of the color solid-state image sensor. The electrical signal is then sensed and amplified in a floating diffusion region (not shown) at the end of the horizontal charge transfer region to be transferred to peripheral circuits.

In the color solid-state image sensor according to the present invention, ions are implanted into the magenta and cyan color filter layers having the highest photosensitivity among the color filter layers to reduce the transmittivity of light having blue composition.

Figure 4:
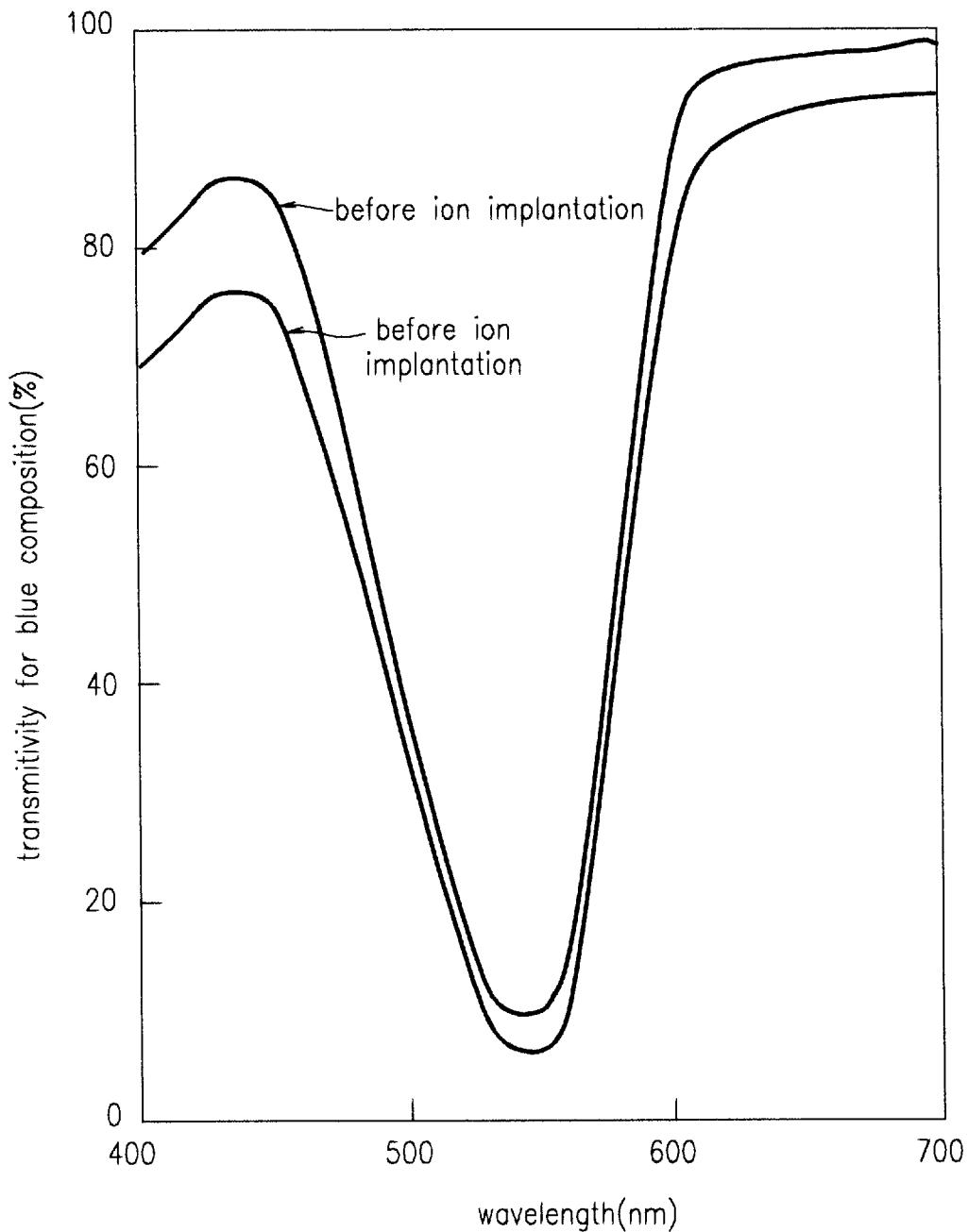
FIG. 4 is a graph showing spectral characteristic of a magenta layer according to the present invention.
Figure 5:
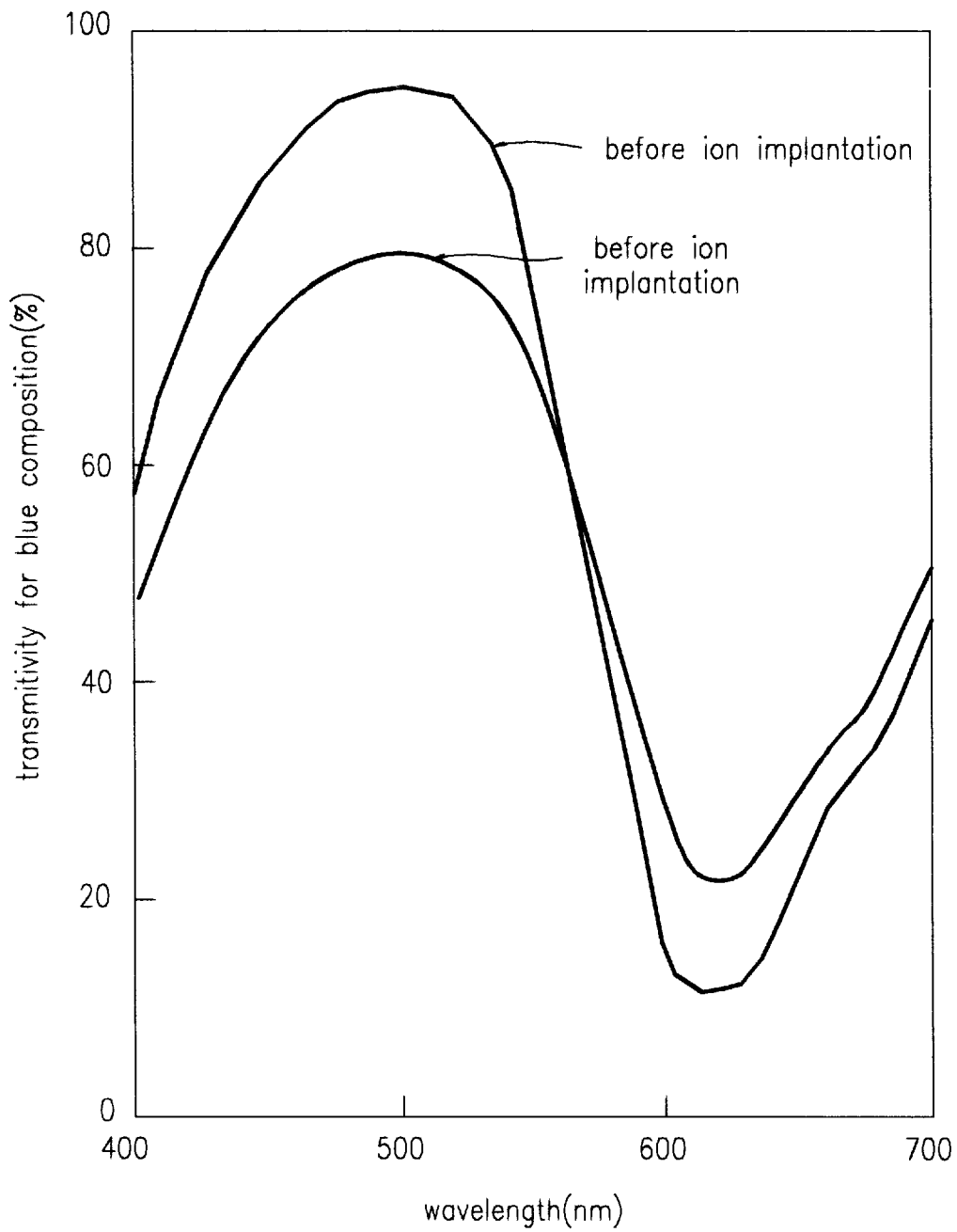
FIG. 5 is a graph showing spectral characteristic of a cyan layer according to the present invention.

FIG. 4 and FIG. 5 are graphs illustrating the spectral characteristic before and after ions are implanted into the magenta and cyan color filter layers, respectively. Please note both magenta and cyan color filter layers have blue composition. As shown in FIGS. 4 and 5, the transmittivity of light having blue composition is reduced after the ion implantation.

The color solid-state image sensor of the present invention has several advantages. First, the blue composition having high photosensitivity in the magenta and cyan color filter layers is reduced by implanting ions capable of varying the transmittivities into the color filter layers.

Since the present invention is capable of controlling efficiently the spectral characteristic in a short wavelength of the color filter layers through ion implantation, it leads to increased efficiency in displaying color signals of the color solid-state image sensor.

It will be apparent to those skilled in the art that various modifications and variations can be made in the method for fabricating the color solid-state image sensor of the present invention without departing from the spirit or scope of the invention. Thus, it is intended that the present invention cover the modifications and variations of the invention provided they come within the scope of the appended claims and their equivalents.

What is claimed is:

1. A method for fabricating a color solid-state image sensor including a plurality of photoelectric conversion regions comprising the steps of:

forming a magenta color filter layer, a yellow color filter layer, and a cyan color filter layer over respective photoelectric conversion regions of the plurality of photoelectric conversion regions; and implanting ions into the magenta and cyan color filter layers to reduce the transmittivity of blue composition of light passing through the magenta and cyan color filter layers.

2. The method as claimed in claim 1, wherein the ions implanted include Ar ions.

3. A method for fabricating a color solid-state image sensor comprising the steps of:

forming a first planarizing layer on a white and black solid-state image sensor;

forming a first color filter layer on a predetermined portion of the first planarizing layer;

forming a second color filter layer on areas of the first planarizing layer where the first color filter layer is not formed;

implanting ions into the first and second color filter layers to vary the transmittivity of the first and second color filter layers;

forming a third color filter layer on the second color filter layer; and forming a second planarizing layer on the first planarizing layer including the first, second and third color filter layers.

4. The method as claimed in claim 3, wherein the white and black solid-state image sensor includes photoelectric conversion regions for converting an image signal of light to an electric signal, and charge transfer regions for transferring the electric signal.

5. The method as claimed in claim 3, wherein the first and second color filter layers transmit light of blue composition.

6. The method as claimed in claim 3, wherein the first color filter layer transmits light of magenta composition, the second color filter layer transmits light of cyan composition, and the third color filter layer transmits light of yellow composition.

7. The method as claimed in claim 3, further comprising the steps of:

forming a micro-lens layer on portions of the second planarizing layer corresponding to the photoelectric conversion regions; and opening a pad portion by selectively removing the first and second planarizing layers.

8. The method as claimed in claim 3, wherein the first, second, and third color filter layers correspond to three of the plurality of photoelectric conversion regions.

9. A method for fabricating a color solid-state image sensor on a white and black solid-state image sensor having a plurality of photoelectric conversion regions, the method comprising the steps of:

forming a first color filter layer, a second color filter layer, and a third color filter layer on the white and black solid-state image sensor; and implanting ions into the first and the second color filter layers to reduce the transmittivity of the blue composition of an incident light passing through the first and the second color filter layers.

10. The method as claimed in claim 9, wherein each of the first, second, and third color filter layers is formed above a different one of the plurality of photoelectric conversion regions.

11. The method as claimed in claim 9, wherein the first color filter layer transmits light of magenta composition, the second color filter layer transmits light of cyan composition, and the third color filter layer transmits light of yellow composition.

12. The method as claimed in claim 9, further comprising the step of forming a first planarizing layer on the white and black solid-state image sensor before forming the first, second and third color filter layers.

13. The method as claimed in claim 12, wherein the first color filter layer is formed on a predetermined portion of the first planarizing layer, and the second color filter layer is formed on a portion of the first planarizing layer where the first color filter layer is not formed.

14. The method as claimed in claim 9, wherein the first and second color filter layers transmit light of blue composition.

15. The method as claimed in claim 12, further comprising the steps of:

forming a second planarizing layer on the first planarizing layer including the first, second and third color filter layers;

forming a micro-lens layer on portions of the second planarizing layer corresponding to the plurality of photoelectric conversion regions; and opening a pad portion by selectively removing the first and second planarizing layers.

* * * * *